(12) United States Patent
Ingalls et al.

(10) Patent No.: US 10,236,036 B2
(45) Date of Patent: Mar. 19, 2019

(54) SENSE AMPLIFIER SIGNAL BOOST

(71) Applicant: Micron Technology, Inc., Boise, ID (US)

(72) Inventors: Charles Ingalls, Meridian, ID (US); Christopher Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/591,015

(22) Filed: May 9, 2017

(65) Prior Publication Data

US 2018/0330766 A1 Nov. 15, 2018

(51) Int. Cl.
*G11C 7/12* (2006.01)
*G11C 7/08* (2006.01)
*G11C 5/14* (2006.01)

(52) U.S. Cl.
CPC .............. *G11C 7/08* (2013.01); *G11C 5/14* (2013.01); *G11C 7/12* (2013.01)

(58) Field of Classification Search
CPC .............. G11C 7/08; G11C 5/14; G11C 7/12
USPC ........................................................ 365/203
See application file for complete search history.

(56) References Cited

U.S. PATENT DOCUMENTS

| | | | |
|---|---|---|---|
| 5,949,729 A * | 9/1999 | Suyama | G11C 11/4091 365/174 |
| 8,068,379 B1 | 11/2011 | Takahashi et al. | |
| 2003/0016059 A1 | 1/2003 | Lee et al. | |
| 2004/0090851 A1 | 5/2004 | Tanzawa et al. | |
| 2005/0265096 A1 | 12/2005 | Obara et al. | |
| 2005/0270889 A1 | 12/2005 | Sekiguchi et al. | |
| 2012/0250437 A1* | 10/2012 | Nagata | G11C 7/18 365/200 |
| 2017/0018295 A1* | 1/2017 | Kim | G11C 7/12 |

OTHER PUBLICATIONS

International Search Report and Written Opinion dated Sep. 5, 2018 for PCT Application No. PCT/US2018/028085, 12 pages.

* cited by examiner

*Primary Examiner* — Tha-O H Bui
(74) *Attorney, Agent, or Firm* — Dorsey & Whitney LLP

(57) ABSTRACT

Apparatuses for signal boost are disclosed An example apparatus includes: first and second digit lines coupled to memory cells; a sense amplifier including: first and second transistors having gates operatively coupled to the first digit line and drains coupled to a first node, sources of the first and second transistors coupled to first and second control lines providing first and second power supply voltage respectively; and third and fourth transistors having gates coupled to the second digit line and drains coupled to a second node, sources of the third and fourth transistors coupled to the first and second control lines respectively; a power line coupled to the first node and the second node; and a power switch providing either the first power supply voltage or a third power supply voltage smaller than the first power supply voltage to the power line.

13 Claims, 13 Drawing Sheets

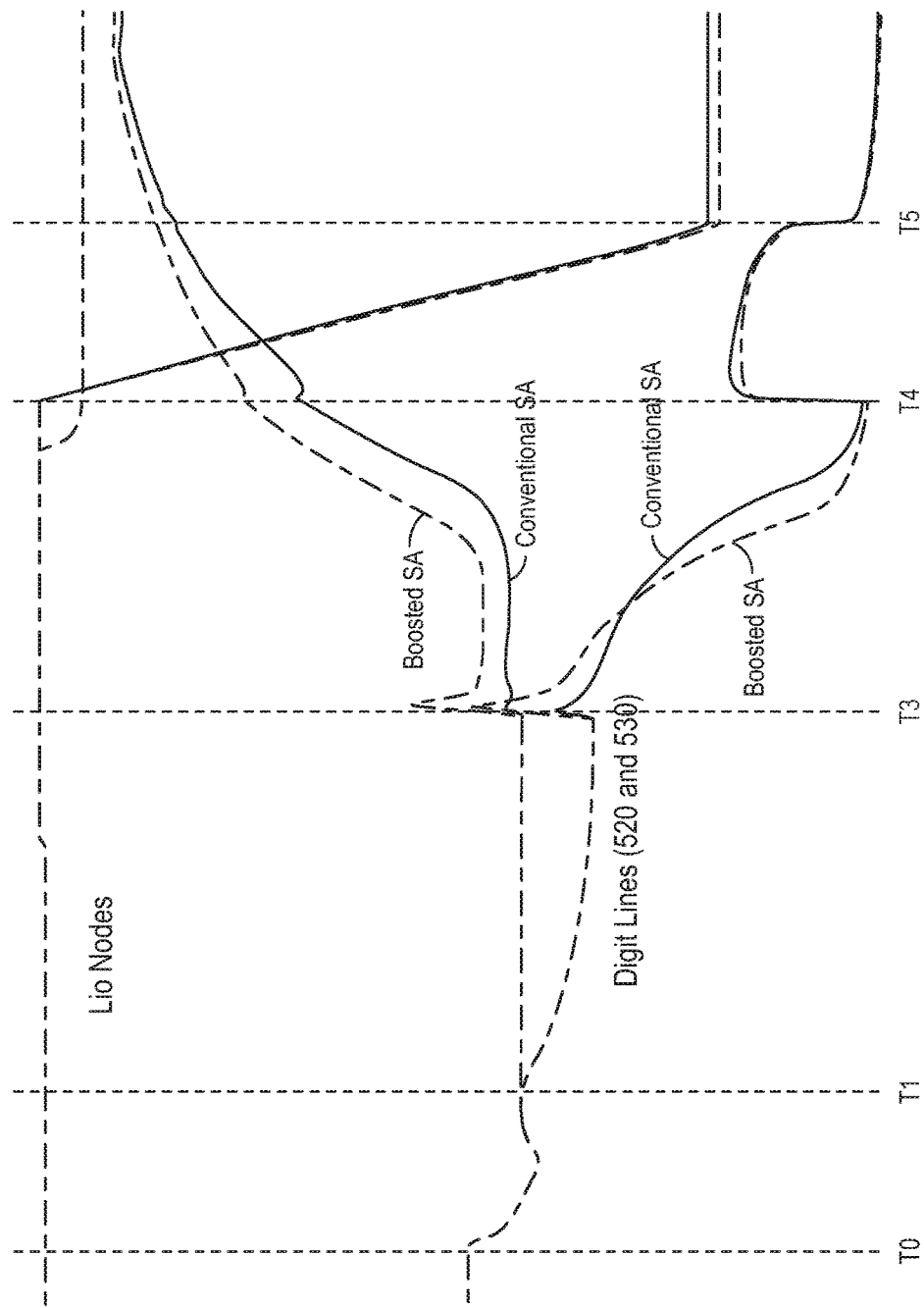

SENSE AMPLIFIER SIGNAL BOOST

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line with respect to a precharge voltage, and an accessed memory cell that is not charged causes a negative change in voltage on the associated digit line with respect to the precharge voltage. The change in voltage on the digit line may be sensed and amplified by a sense amplifier to indicate the value of the data state stored in the memory cell.

Conventional sense amplifiers are typically coupled to a pair of complementary digit lines to which a large number of memory cells (not shown) are connected. FIG. 1 is a circuit diagram of a conventional sense amplifier circuit and a pair of complementary digit lines. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line does not and serves as a reference for the sensing operation. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

The digit lines are precharged during a precharge period to a precharge voltage, such as one-half of a supply voltage, so that a voltage difference can be accurately sensed and amplified on sense nodes during a subsequent sensing operation. However, when a low data state signal from a memory cell is weakly signaled, while P-channel transistors of a sense amplifier has a weakness to voltage threshold (Vt) offset, the digit lines may not be amplified to reflect a logic high or low level in a timely fashion, and sensed and amplified levels on sense nodes may not be reflected on local input/output (LIO) nodes while the LIO nodes are coupled to the sense nodes. Such delay in amplification can cause the sense amplifier to erroneously to provide signals in the wrong direction. There is, therefore, a need for a sense amplifier design that timely amplifies the digit lines even for the weak low data state signal from the memory cell.

BRIEF DESCRIPTION OF THE DRAWINGS

FIG. 7 is a timing diagram of signals on LIO nodes and digit lines coupled to a strong cell in the conventional sense amplifier of FIG. 1 (Prior Art) and the sense amplifier of FIG. 5 in accordance with an embodiment of the disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 2:
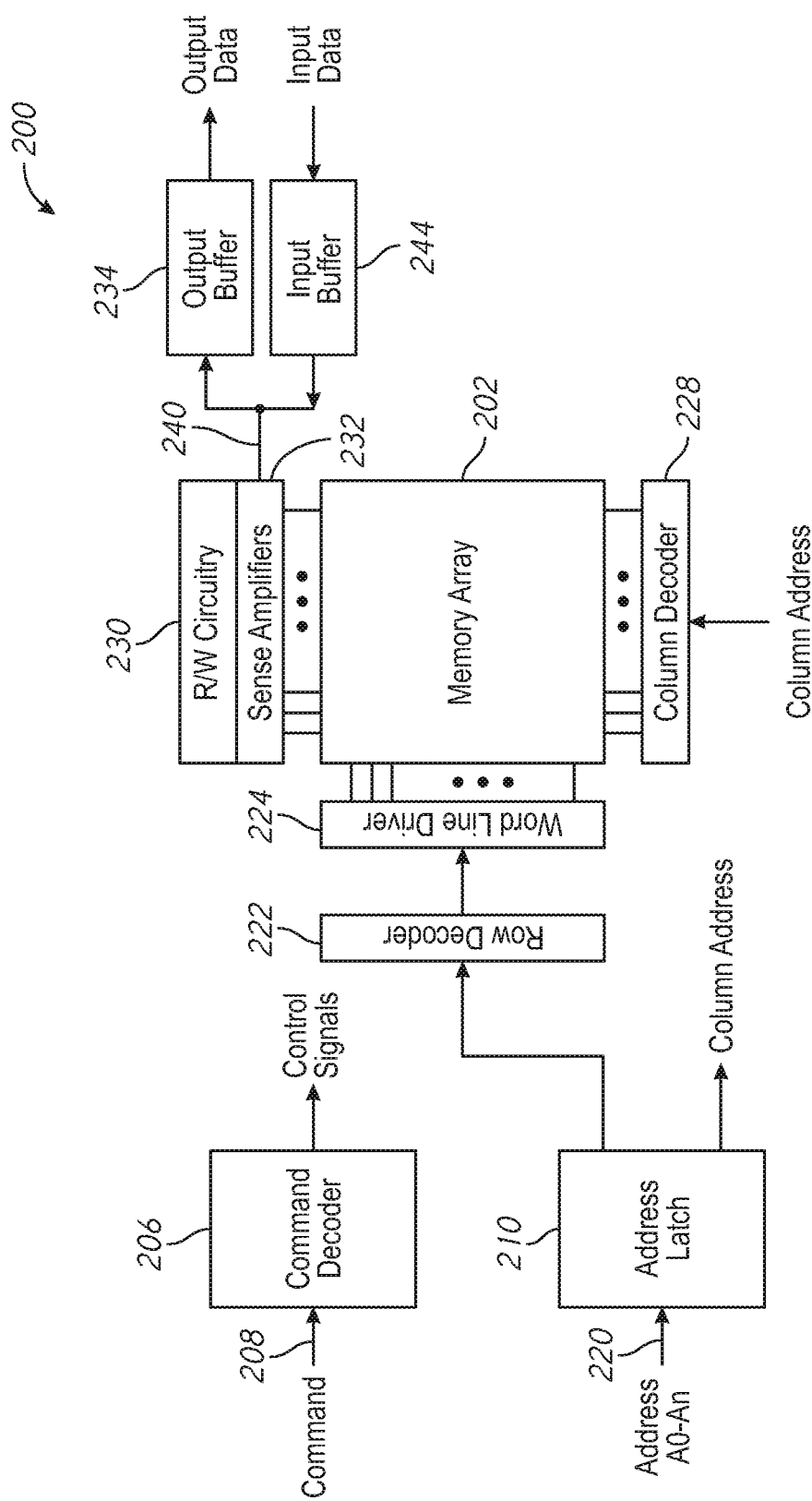
FIG. 2 is a block diagram of a portion of a memory system in accordance with an embodiment of the disclosure.

FIG. 2 is a block diagram of a portion of a memory system 200 in accordance with an embodiment of the disclosure. The memory system 200 includes an array 202 of memory cells, which may be, for example, DRAM memory cells, SRAM memory cells, flash memory cells, or some other types of memory cells. The memory system 200 includes a command decoder 206 that receives memory commands through a command bus 208 and generates corresponding control signals within the memory system 200 to carry out various memory operations. Row and column address signals are applied to the memory system 200 through an address bus 220 and provided to an address latch 210. The address latch then outputs a separate column address and a separate row address.

The row and column addresses are provided by the address latch 210 to a row address decoder 222 and a column address decoder 228, respectively. The row address decoder 222 is connected to word line driver 224 that activates respective rows of memory cells in the array 202 corresponding to received row addresses. In response, memory cells of the array 202 are coupled to digit lines extending through the array 202 for the respective data states to be sensed by sense amplifiers 232. The sense amplifiers 232 include at least one sense amplifier according to an embodiment of the invention. The column address decoder 228 selects the digit lines corresponding to respective column addresses. The selected digit lines corresponding to a received column address are coupled to read/write circuitry 230 to provide read data to a data output buffer 234 via an input-output data bus 240. Write data are applied to a data input buffer 244 and the memory array read/write circuitry 230. The write data are written to the memory cells of the array 202 through the sense amplifiers 232. The command decoder 206 responds to memory commands applied to the command bus 208 to perform various operations on the memory array 202. In particular, the command decoder 206 is used to generate internal control signals to read data from or write data to the memory array 202.

Figure 3:
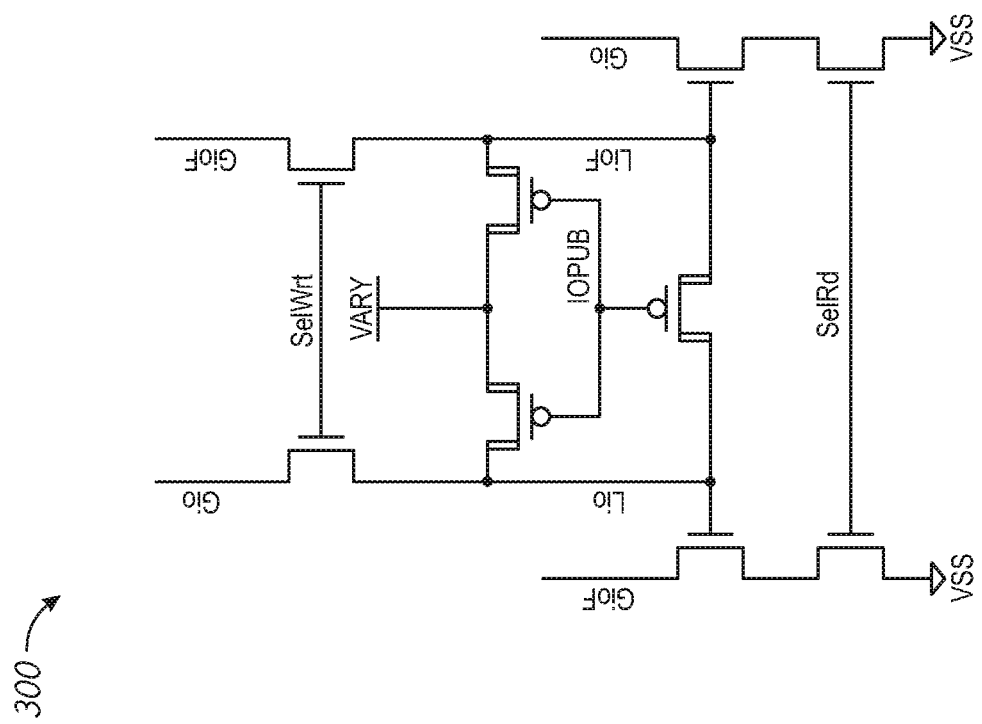
FIG. 3 is a schematic diagram of a read/write amplifier in accordance with an embodiment of the disclosure.

FIG. 3 is a schematic diagram of a read/write amplifier 300 in accordance with an embodiment of the disclosure. The read/write amplifier 300 may be included in the R/W circuitry 230 in FIG. 2. The read/write amplifier 300 is merely an example and a conventional read/write amplifier may be applied in the R/W circuitry 230, instead. The read/write amplifier 300 may be disposed between an array power supply voltage VARY and a reference power supply voltage VSS, and may further receive an input/output pull up signal IOPUB as a precharge signal. In a read operation, a SelRd signal may be activated responsive to a READ command and the read/write amplifier 300 may receive data signals on a pair of complementary local input/output signal nodes Lio and LioF from LIO nodes at gates of n-channel transistors of a sense amplifier (e.g., the sense amplifier 232) that may be coupled to the Lio and LioF nodes. Since sources of the n-channel transistors may be coupled to the reference power supply voltage VSS responsive to the SelRd signal, the data signals may be amplified and provided to a pair of complementary global input/output signal nodes GioF and Gio. Similarly, in a write operation, a SelWrt signal may be activated responsive to a WRITE command and n-channel transistors which may receive the SelWrt signal at gates may couple the pair of complementary global input/output signal nodes Gio and GioF to the pair of complementary local input/output signal nodes Lio and LioF, respectively.

Figure 4:
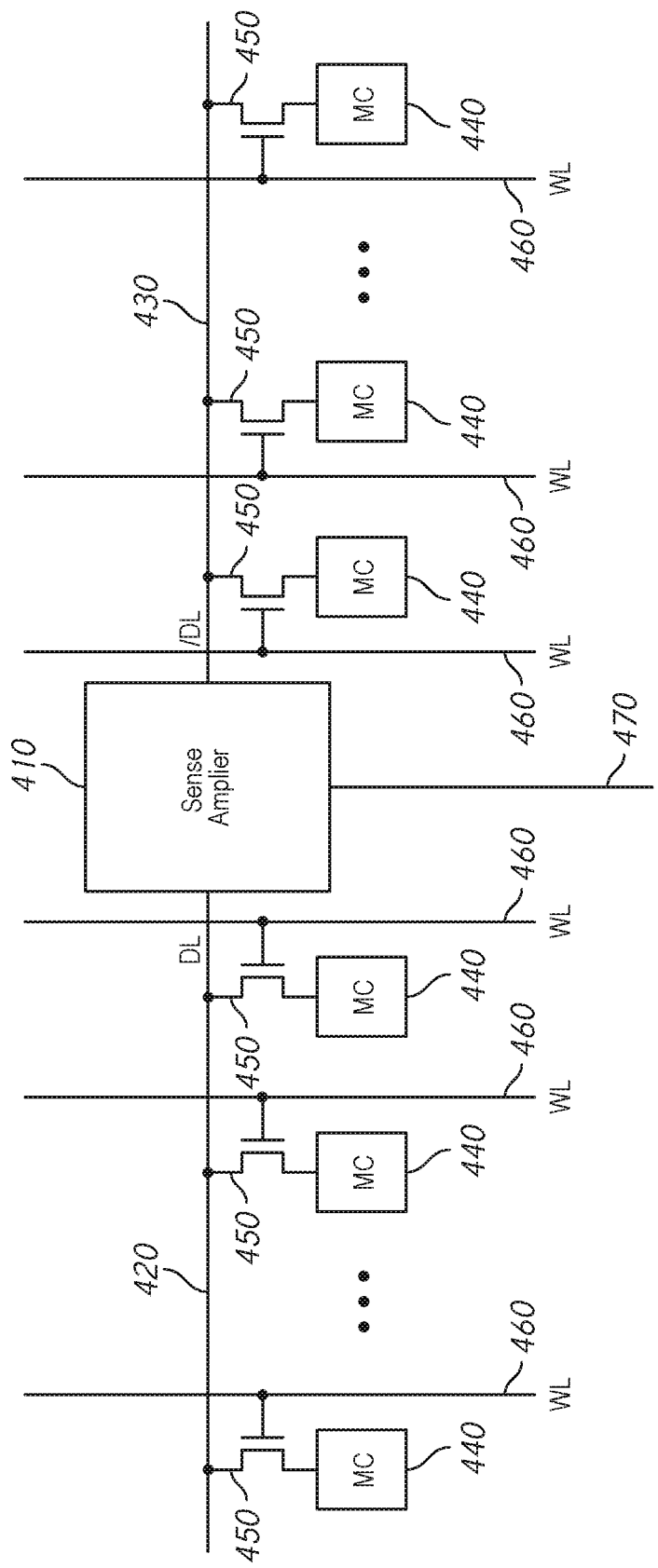
FIG. 4 is a schematic diagram of a sense amplifier and a pair of complementary digit lines in accordance with an embodiment of the disclosure.

FIG. 4 is a portion of a sense amplifier 410 and a pair of true and complementary digit (or bit) lines DL 420 and/DL 430 in accordance with an embodiment of the disclosure. The sense amplifier 410 is coupled to digit lines DL 420 and/DL 430. Memory cells 440 are coupled through respective access devices (e.g., transistors) 450 to either the digit line 420 or 430. In operation, a memory cell 440 is coupled to a digit line 420 or 430 through the respective access device 450 in response to a respective word line 460 becoming active. A data state stored by the memory cell 440 is sensed and amplified by the sense amplifier 410 to drive the digit line to which that memory cell is coupled to a high or low voltage level corresponding to the sensed data state. The other digit line is driven to the complementary voltage level.

Figure 5:
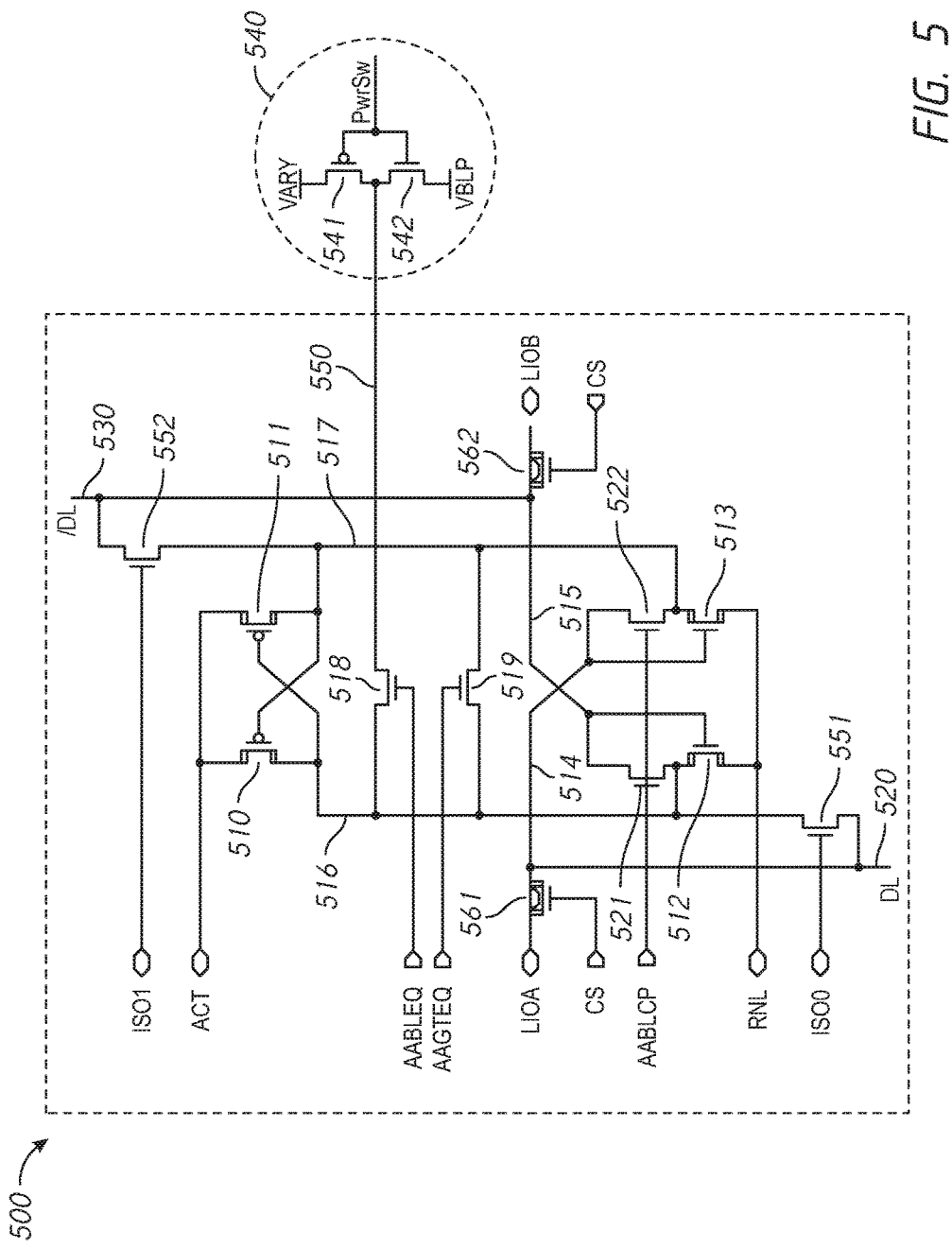
FIG. 5 is a circuit diagram of a sense amplifier in accordance with an embodiment of the disclosure.

FIG. 5 is a circuit diagram of a sense amplifier 500 in accordance with an embodiment of the disclosure. The sense amplifier 500 may be included as each sense amplifier of the sense amplifiers 232 of FIG. 2. For example, the sense amplifier 500 may include first type of transistors (e.g. p-type field effect transistors (PFET)) 510, 511 having drains coupled to drains of second type of transistors (e.g., n-type field effect transistors (NFET)) 512, 513, respectively. The first type of transistors 510, 511 and the second type of transistors 512, 513 form complementary transistor inverters including a first inverter including the transistors 510 and 512 and a second inverter including the transistors 511 and 513. The first type of transistors 510, 511 may be coupled to a Psense amplifier control line (e.g., an activation signal ACT) which may provide a supply voltage (e.g., an array voltage VARY: Vcc for memory cell arrays) at an active "high" level. The second type of transistors 512, 513 may be coupled to an Nsense amplifier control line (e.g., a Row Nsense Latch signal RNL) that may provide a reference voltage (e.g., GND) at an active "low" level. The sense amplifier 500 may sense and amplify the data state applied to sense nodes 514, 515 through the digit (or bit) lines DL 520 and/DL 530, respectively. Nodes 516 and 517 that may be gut nodes coupled to drains of the second type of transistors 512, 513 may be coupled to the digit lines 520 and 530 via isolation transistors 551 and 552, controlled by isolation signals ISO0 and ISO1. For example, the digit lines 520 and 530 (sense nodes 514 and 515) may be coupled to local input/output nodes A and B (LIOA/B) through the second type of transistors 561 and 562, respectively, which may be rendered conductive when a column select signal CS is active. LIOA and LIOB may be Lio and LioF of FIG. 3, respectively.

The second type of transistors 521, 522 may have drains coupled to the sense nodes 515 and 514 and sources coupled to the gut nodes 516 and 517 coupled to the drains of the second type of transistors 512 and 513, respectively. Gates of the second types of transistors 521 and 522 may receive a signal AABLCP and may provide voltage compensation for voltage threshold imbalance between the second type of transistors 512 and 513. The sense amplifier 500 may include transistors 518 and 519, where the transistor 518 may couple the gut node 516 to a global power bus 550 and the transistor 519 may couple the gut node 516 to the gut node 517. The global power bus 550 may be coupled to a power switch 540. The power switch 540 may switch between a node coupled to an array voltage VARY and a node coupled to a bit line precharge voltage VBLP. Thus, the global power bus 550 may provide either the array voltage VARY or the bit line precharge voltage VBLP that is substantially smaller than the array voltage VARY. For example, the bit line precharge voltage VBLP may be approximately one-half of the array voltage VARY. For example, the power switch 540 may include a first type of transistor 541 that may couple the global power bus 550 to the array voltage VARY and a second type of transistor 542 that may couple the global power bus 550 to the bit line precharge voltage VBLP. Gates of the transistors 541 and 542 may receive a power switch signal PwrSw, and one of the transistors 541 and 542 may be conductive to couple the global power bus 550 to either the array voltage VARY or the bit line precharge voltage VBLP. The transistors 518 and 519 may couple the global power bus 550 to the gut nodes 516 and 517 responsive to equilibrating signals AAGTEQ and AABLEQ provided on gates of the transistors 518 and 519.

Figure 6:
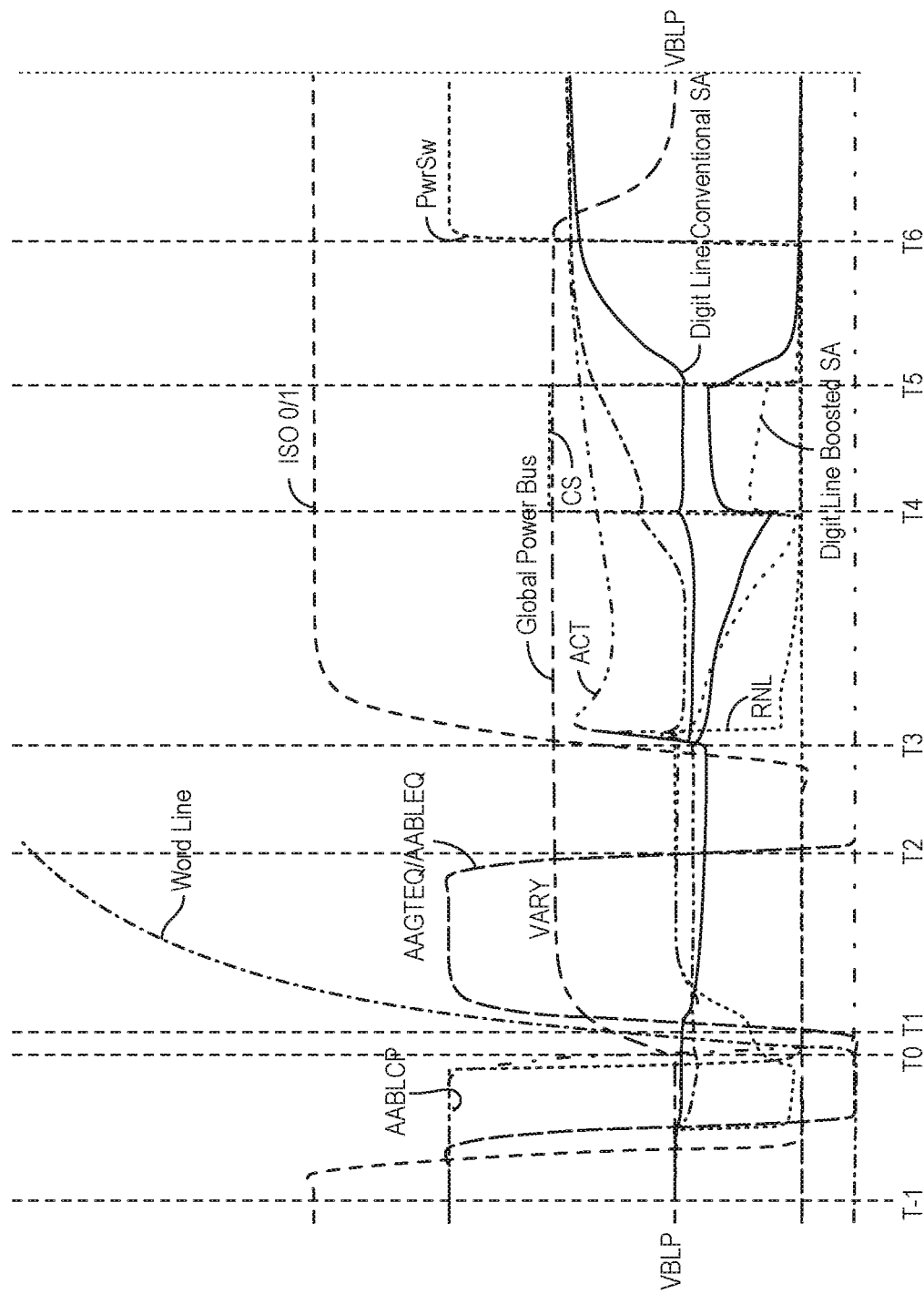
FIG. 6 is a timing diagram of control signals and digit line signals related to the sense amplifier of FIG. 5, in accordance with an embodiment of the disclosure.

FIG. 6 is a timing diagram of control signals and digit line signals related to the sense amplifier 500 of FIG. 5, in accordance with an embodiment of the disclosure. In operation, at T−1, the global power bus 550 may be supplied with the bit line precharge voltage VBLP responsive to an active state (e.g. a logic high level) of the PwrSw signal. Further, the AABLCP signal, the ISO0 and ISO1 signals and the AAGTEQ and AABLEQ signals may be in their active states, respectively. Accordingly, each of the digit lines 520 and 530, the sense nodes 514 and 515 and the gut nodes 516 and 517 may be precharged at the precharge voltage VBLP. The ISO0 and ISO1 signals and the AAGTEQ and AABLEQ signals may be then set to respective inactive state prior to T0 to turn off the transistors 551, 552, 518 and 519. On the other hand, the signal AABLCP may be still in an active state until T0 to turn on the transistors 521 and 522, that may couple the nodes 514 and 515 to the gut node 517 and 516, respectively, and the drain and the gate of the transistor 512 may be coupled and the drain and the gate of the transistor 513 may be coupled. At T0, the signal AABLCP may be set to an inactive state to turn off the transistors 521 and 522. Further the PwrSw signal may be changed to an inactive level (logic low level) to turn the transistors 541 and 542 on and off, respectively. The global power bus 550 may be thereby increased to the array voltage VARY.

Responsive to a word line receiving a selection level (e.g., a logic high level) at T1, the equilibrating signals AAGTEQ and AABLEQ may be set again to an active state. For example, a voltage threshold compensation (VtC) measurement may be executed for the second type of transistors 512 and 513, while the equilibrating signals AAGTEQ and AABLEQ are being in the active state from time T1 to T2. As described above, the PwrSw signal may be set to an inactive state at T0 during the AABLCP signal being in the inactive state and the equilibrating signals AAGTEQ and AABLEQ are being again in the active state at T1, and the global power bus 550 may provide the array voltage VARY and the transistors 518 and 519 may couple the global power bus 550 to the gut nodes 516, 517, while the transistors 522 and 521 may decouple the nodes 514 and 515 from the gut nodes 517 and 516 responsive to the inactive AABLCP signal and the isolation transistors 551 and 552 may decouple the gut nodes 517 and 516 from the digit lines 520 and 530 responsive to the inactive isolation signals ISO0 and ISO1. Thus, the global power bus 550 may provide the array voltage VARY, higher than the bit line precharge voltage VBLP (≈½ VARY), to the gut nodes 516 and 517 while the equilibrating signals AAGTEQ and AABLEQ are being in the active state. A voltage threshold compensation (VtC) measurement may not be executed for the first type of transistors 510 and 511. Thus, the measured voltage threshold Vt for the second type of transistors 512 and 513 may be provided on the digit lines 514 and 515 for compensating an imbalance of the voltage threshold Vt between the second type of transistors 512 and 513. At T2, the AAGTEQ and AABLEQ signals may be set to respective inactive states to turn off the transistors 518 and 519. The PwrSw signal may be switched from an active state (logic high level) to an inactive state (logic low level) while the equilibrating signals AAGTEQ and AABLEQ is being again in the active state (e.g., prior to T2).

At T3, the isolation signals ISO0 and ISO1 may be set to an active state. Furthermore, the ACT signal and the RNL signal may be activated and set to the logic high level (e.g., the array voltage VARY) and the logic low level (GND), respectively. The ISO transistor 551 may couple the digit line 520 to the gut node 516 that are coupled to drains of the first type of transistor 510 and the second type of transistor 512 and the ISO transistor 552 may couple the digit line 530 to the gut node 517 that are coupled to drains of the first type of transistor 511 and the second type of transistor 513, responsive to the isolation signals ISO0 and ISO1 in the active state. Sense and amplify operations are then performed with the voltage threshold Vt compensation voltage to balance the responses of the second type of transistors 512 and 513. For example, in response to a memory cell 440 being coupled to a digit line through its respective access device 450 (FIG. 4), a voltage difference is created between the digit lines 520 and 530 (the guts nodes 516 and 517). The voltage difference is sensed by the second type of transistors 512, 513 as the sources of the second type of transistors 512, 513 begin to be pulled to ground through fully activated RNL signal, and one of the second type of transistors 512, 513 with a gate coupled to the digit line with the slightly higher voltage begins conducting. When a memory cell (e.g., the memory cell 440) coupled to the gut node 516 through the digit line 520 stores a high data state, for example, the transistor 513 may begin conducting. Additionally, the other transistor 512 may become less conductive as the voltage of the gut node 517 with the slightly lower voltage decreases through the conducting transistor 513. Thus, the slightly higher and lower voltages are amplified to logic high and logic low voltages while the isolation signals ISO0 and ISO1 in the active state.

As the CS signal may be activated (e.g., responsive to the READ command) at T4, the digit lines 520 and 530 (sense nodes 514 and 515) may be coupled to the LIO nodes (LIOA and LIOB) and the data output may be provided to the LIO nodes. Thus, the data may be read out from the LIO nodes. After a read operation is completed at T5 by setting the CS signal to an inactive state, the PwrSw signal at the power switch 540 may be set to an active state at T6 to supply the global power bus 550 with the bit line precharge voltage VBLP. Thereafter, although not shown in FIG. 6, the AABLCP, AAGTEQ and AABLEQ signals may be set again to respective active levels to turn on the transistors 521, 522, 518 and 519. Digit lines of the conventional sense amplifier (e.g., in FIG. 1) may not be amplified while the CS signal is in the active state, whereas digit lines of the sense amplifier 500 (Digit Line Boosted SA) are amplified rapidly while the CS signal is in the active state as shown in FIG. 6. Therefore, the LIO nodes may not receive the sensed signals properly amplified with the conventional sense amplifier, on the other hand, the sense amplifier 500 may timely amplify the sensed signals to sufficient levels and provide the amplified signals to the LIO nodes. This will be discussed below in detail.

Figure 1:
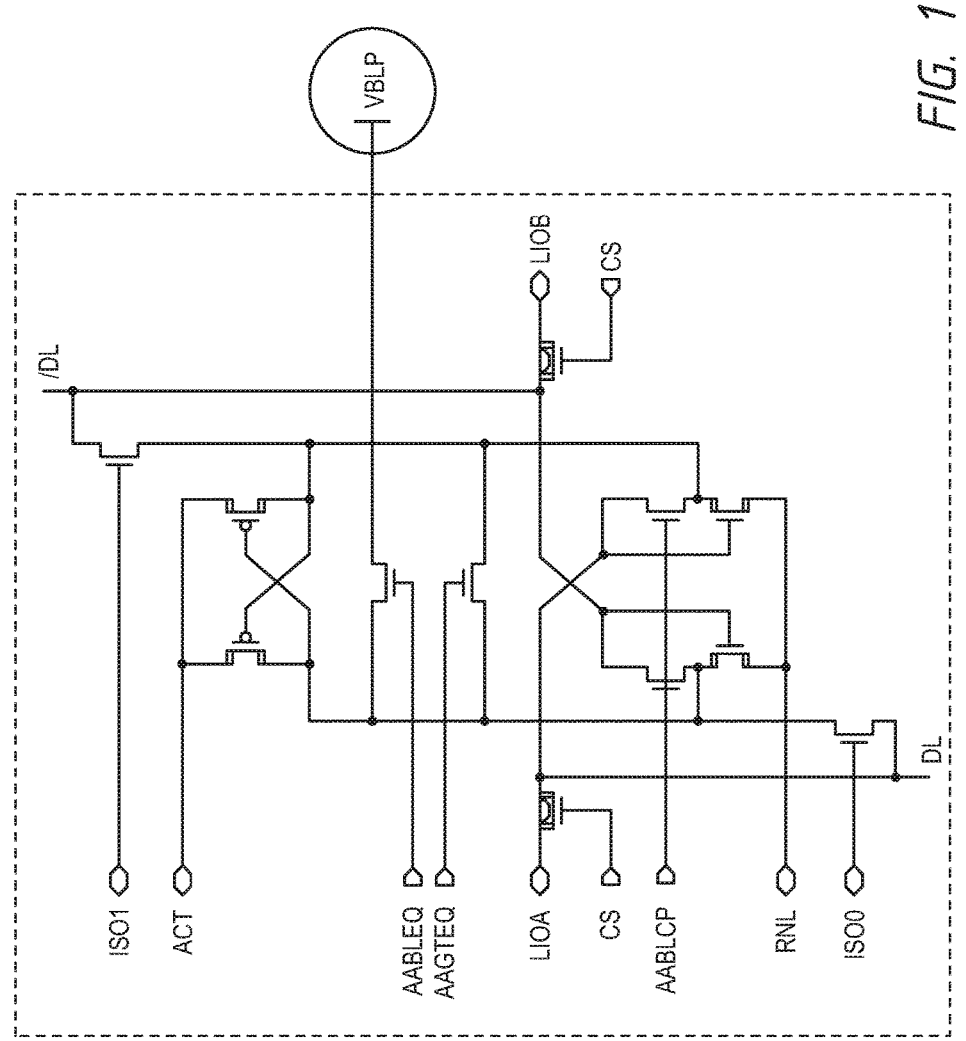
FIG. 1 is a circuit diagram of a conventional sense amplifier circuit and a pair of complementary digit lines.

FIG. 7 is a timing diagram of signals on LIO nodes and digit lines coupled to a strong cell in the conventional sense amplifier of FIG. 1 (Prior Art) and the sense amplifier 500 of FIG. 5 in accordance with an embodiment of the disclosure. The strong cell may be defined as a large stored charge which produces a large voltage when charges are shared with its digit line. When the memory cell is the strong cell that stores a low data state (e.g., zero, a logic low level, a lower voltage), for example, the digit line 530 may provide a high data state signal (e.g., a signal slightly higher than a reference signal) and the transistor 512 may begin conducting. Simultaneously, the digit line 520 may provide a low data state signal (e.g., a signal slightly lower than the reference signal) and the other transistor 513 may become less conductive as the voltage of the gut node 516 with the slightly lower voltage decreases through the conducting transistor 512. As a result, the LIOA node coupled to one sense node 514 may provide a logic low signal and the LIOB node coupled to the other sense node 515 may provide a logic high signal, upon activation of a CS signal. While the memory cell is the strong cell, the LIOA node and the LIOB node of the conventional sense amplifier of FIG. 1 and the sense amplifier 500 in FIG. 5 may take similar voltage transitions as shown in FIG. 7.

Figure 8A:
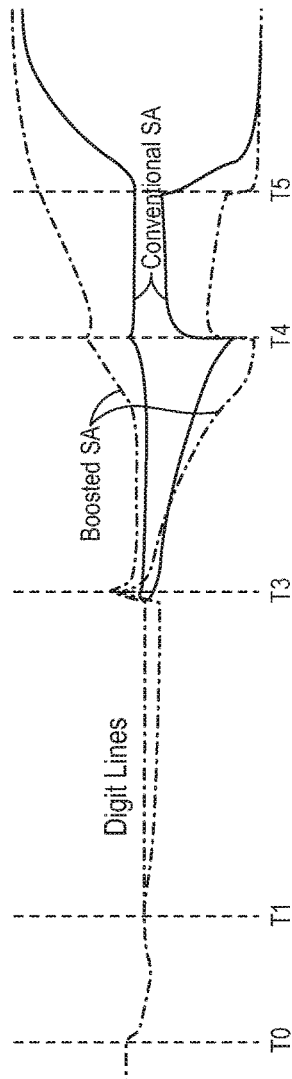
FIGS. 8A to 8C are timing diagrams of signals on digit lines coupled to a weak cell, gut nodes and both in the conventional sense amplifier of FIG. 1 (Prior Art) and the sense amplifier of FIG. 5 in accordance with an embodiment of the disclosure.
Figure 8B:
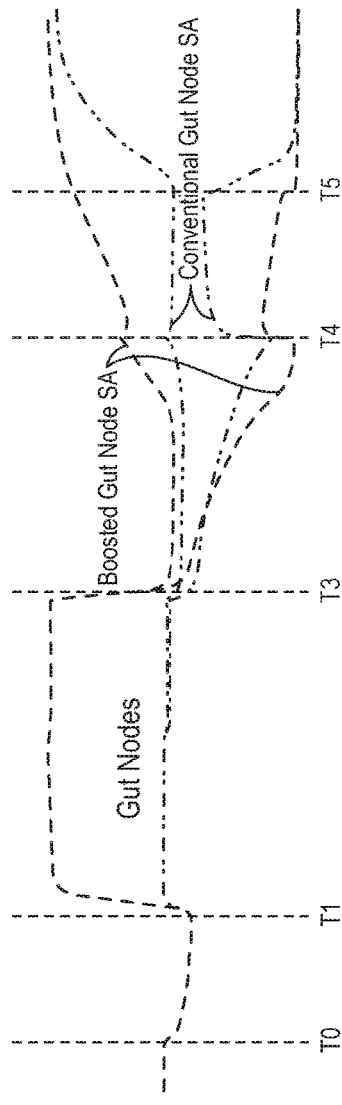
Figure 8C:
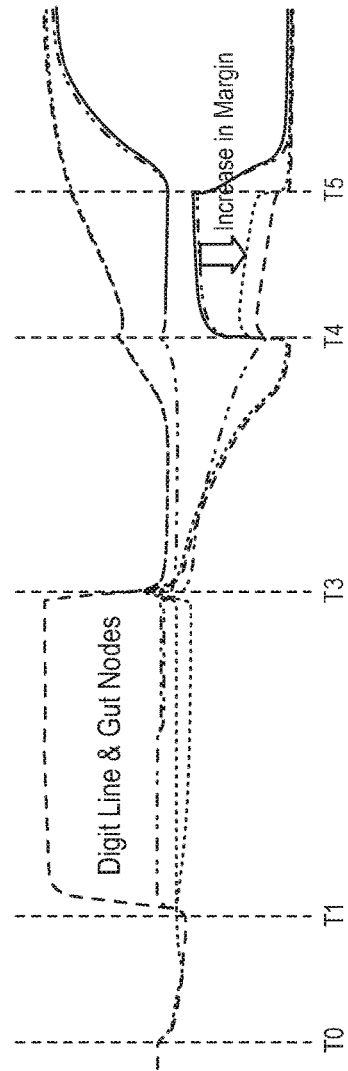

FIGS. 8A to 8C are timing diagrams of signals on digit lines coupled to a weak cell, gut nodes, and both in the conventional sense amplifier of FIG. 1 (Prior Art) and the sense amplifier 500 of FIG. 5 in accordance with an embodiment of the disclosure. The weak cell may be defined as a small stored charge which produces a small voltage when charges are shared with its digit line. For example, when the memory cell is the weak cell that may provide a weak signal for the low data state, the digit line 520 may provide a low data state signal (e.g., a signal slightly lower than the reference signal) and the digit line 530 may provide a high data state signal (e.g., a signal slightly higher than a reference signal) to indicate the low data state in the memory cell, as shown in FIG. 8A. However, the low data state signal of the digit line 520 may not be low enough to turn off the transistor 513 to be less conductive and the high data state signal of the digit line 530 may not be high enough to turn on the transistor 512 as shown in FIG. 8A, if a voltage of the gut node 516 coupled to the drain node of the transistor 512 is set to the bit line precharge voltage VBLP as shown in FIG. 8B.

Figure 9:
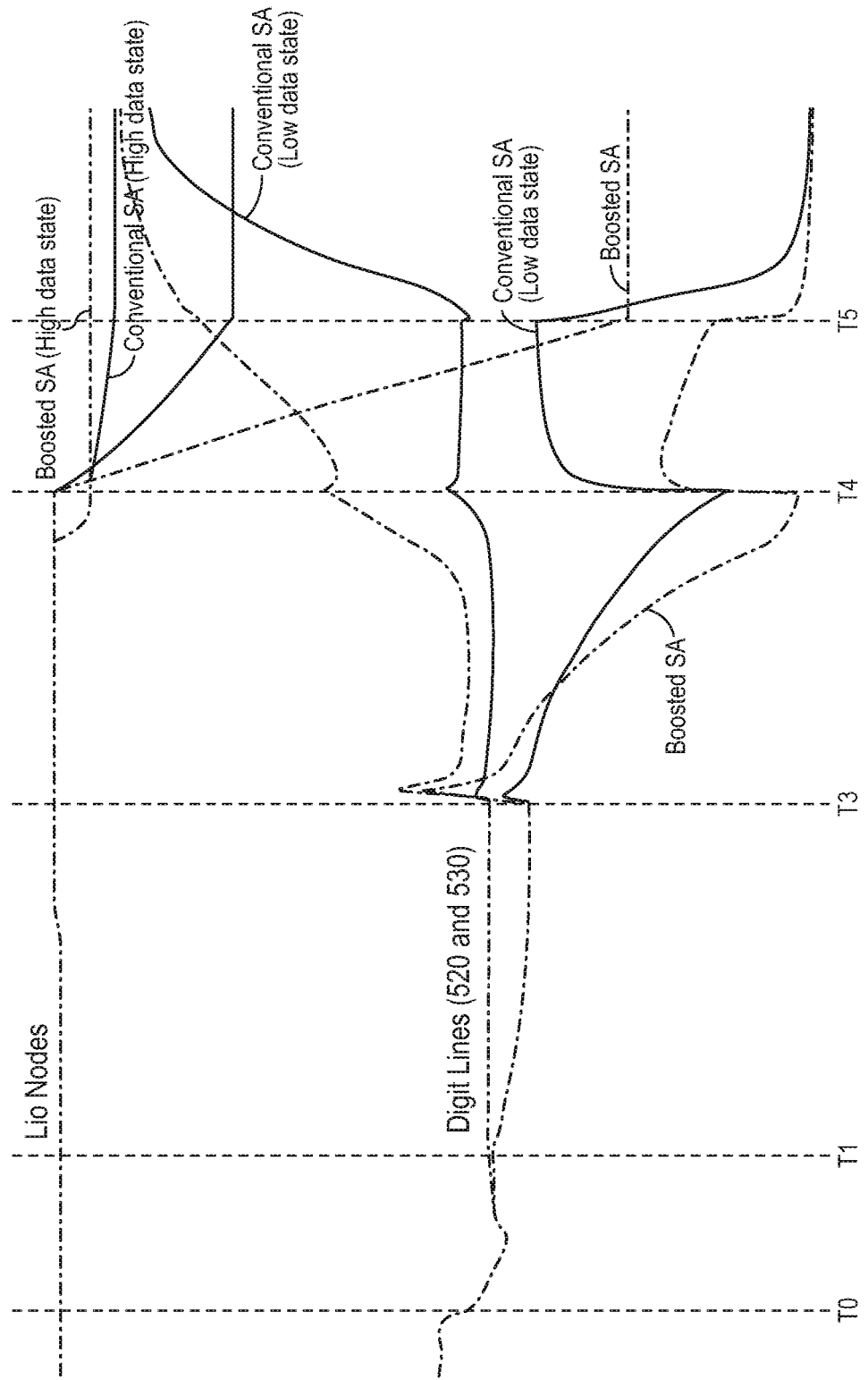
FIG. 9 is a timing diagram of signals on LIO nodes and digit lines coupled to a weak cell in the conventional sense amplifier of FIG. 1 (Prior Art) and the sense amplifier of FIG. 5 in accordance with an embodiment of the disclosure.

FIG. 9 is a timing diagram of signals on LIO nodes and digit lines coupled to a weak cell in the conventional sense amplifier of FIG. 1 (Prior Art) and the sense amplifier 500 of FIG. 5 in accordance with an embodiment of the disclosure. If a voltage of the gut node 516 coupled to the drain node of the transistor 512 is set to a higher voltage (e.g., the array voltage VARY) as shown in FIG. 8B, the transistor 512 may begin conducting, simultaneously, the other transistor 513 may become less conductive. Thus, as shown in FIG. 8C, there is an increase in margin in the low state signal on the digit line that may have a voltage sufficiently low. The sense amplifier 500 may provide may provide a logic low signal on the LIOA node 514 and may provide a logic high signal on the LIOB node 515, upon activation of a CS signal, as shown in FIGS. 6 and 9.

Figure 10:
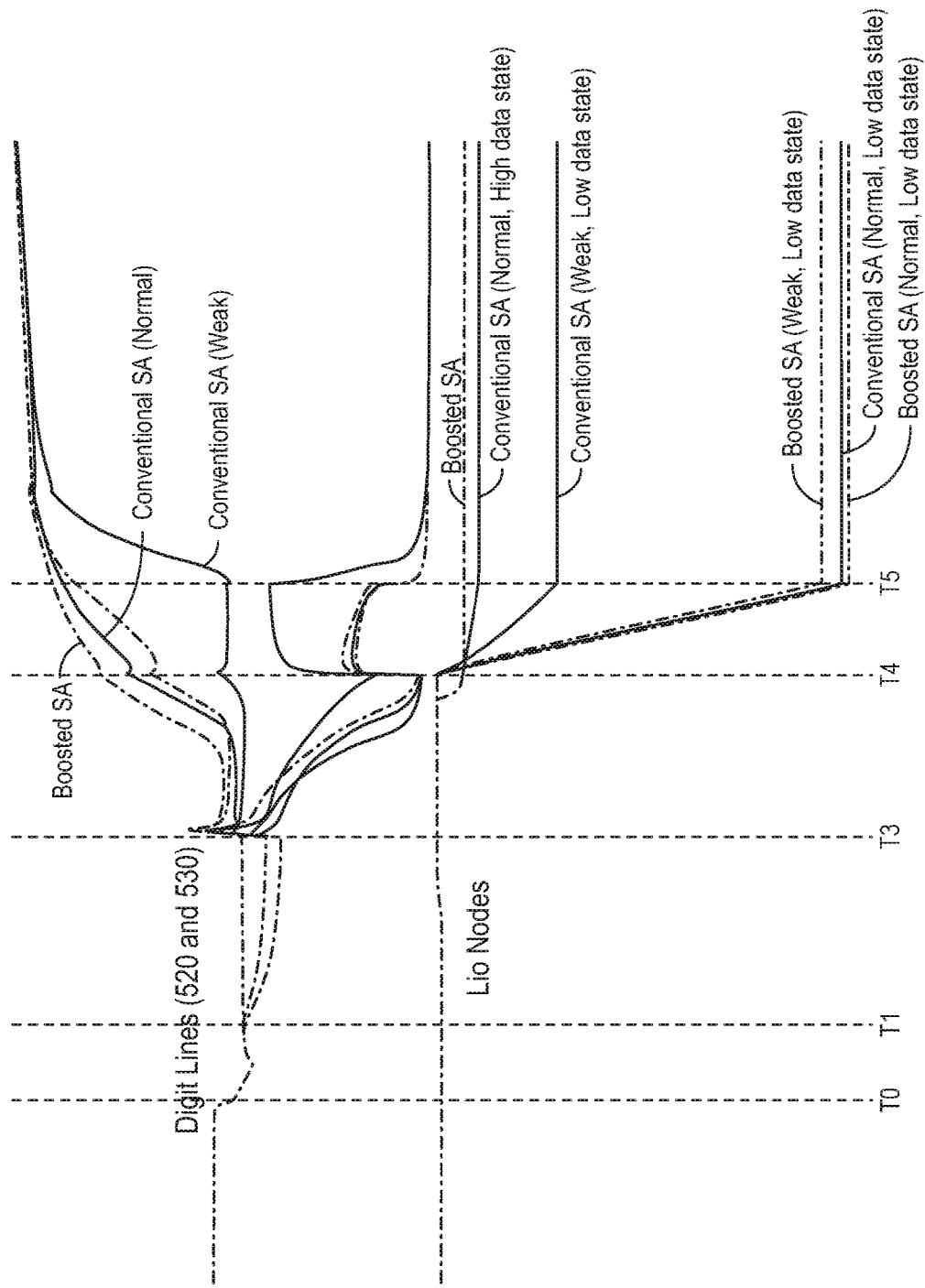
FIG. 10 is a timing diagram of signals coupled to a strong cell and a weak cell in the conventional sense amplifier of FIG. 1 (Prior Art) and the sense amplifier of FIG. 5 in accordance with an embodiment of the disclosure.

FIG. 10 is a timing diagram of signals on LIO nodes and digit lines coupled to a strong cell and a weak cell in the conventional sense amplifier of FIG. 1 (Prior Art) and the sense amplifier of FIG. 5 in accordance with an embodiment of the disclosure. In case of the strong cell, the LIOA and LIOB nodes of the conventional sense amplifier of FIG. 1 and the sense amplifier 500 in FIG. 5 may take similar voltage transitions as shown in FIG. 10. In case of the weak cell in a low data state, the LIOA and LIOB nodes of the conventional sense amplifier of FIG. 1 may not be able to lower the voltage of the LIOA and LIOB nodes and transistors M2 and M5 of the read amplifier 300 of FIG. 3 may not be able to timely turn on/turn off. On the other hand, the LIOA and LIOB nodes of the sense amplifier 500 (Boosted SA) of FIG. 5 may sufficiently lower the voltage of the LIOA and LIOB nodes and transistors M2 and M5 of the read amplifier 300 of FIG. 3 may timely turn on/turn off. Thus, the low data state of the weak cell may be properly transferred to the global input/output line to be read out.

Figure 11:
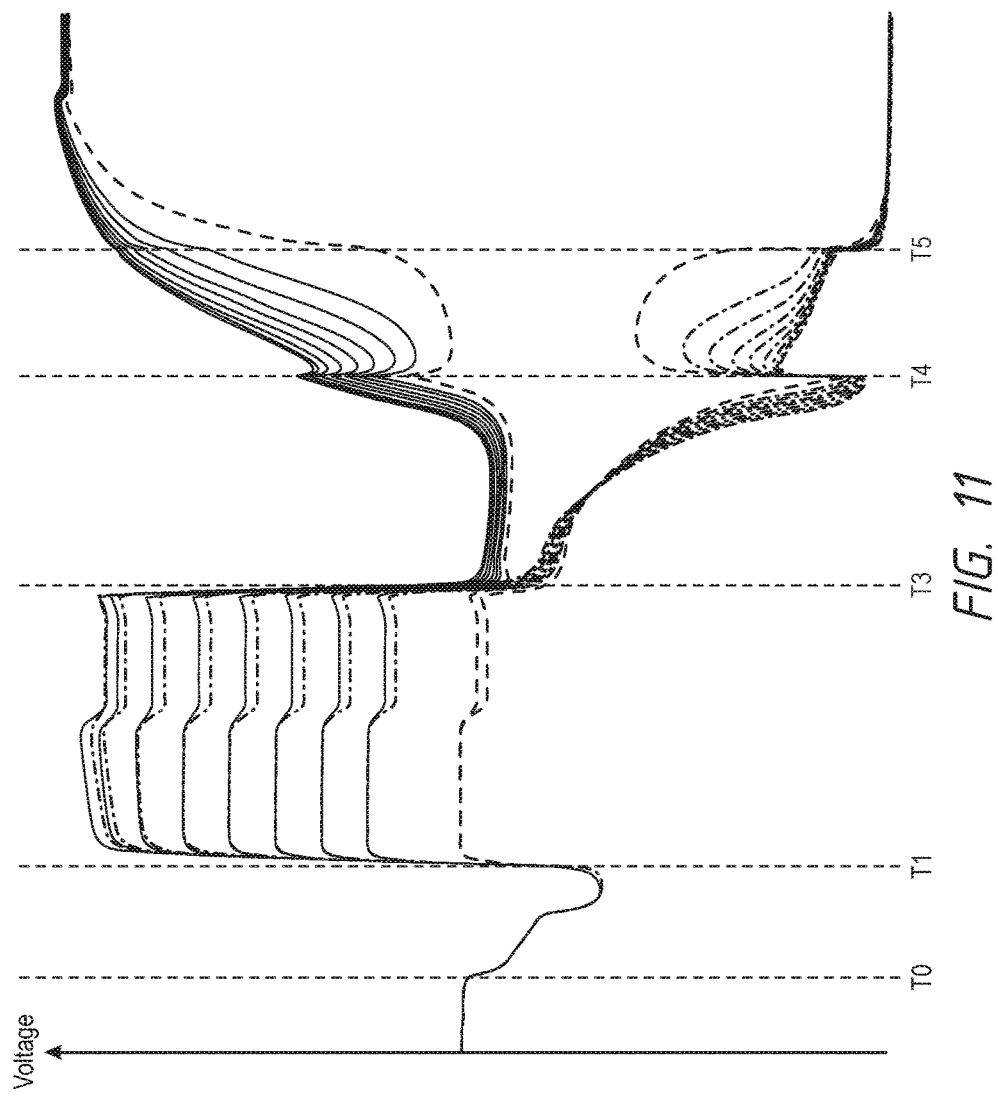
FIG. 11 is a timing diagram of experimental signals on gut nodes coupled to a weak cell in the conventional sense amplifier of FIG. 1 (Prior Art) and the sense amplifier of FIG. 5 in accordance with an embodiment of the disclosure.

FIG. 11 is a timing diagram of signals on gut nodes coupled to a weak cell in the conventional sense amplifier of FIG. 1 (Prior Art) and the sense amplifier of FIG. 5 in accordance with an embodiment of the disclosure. The signals may reflect variations of gut node boost levels in voltage. Higher the gut boost level is, rise/fall of gut nodes (and thus digit lines) during the active state of the CS signal may be faster and the higher gut boost level may enable faster and more accurate data transfer in a timely manner.

Figure 12:
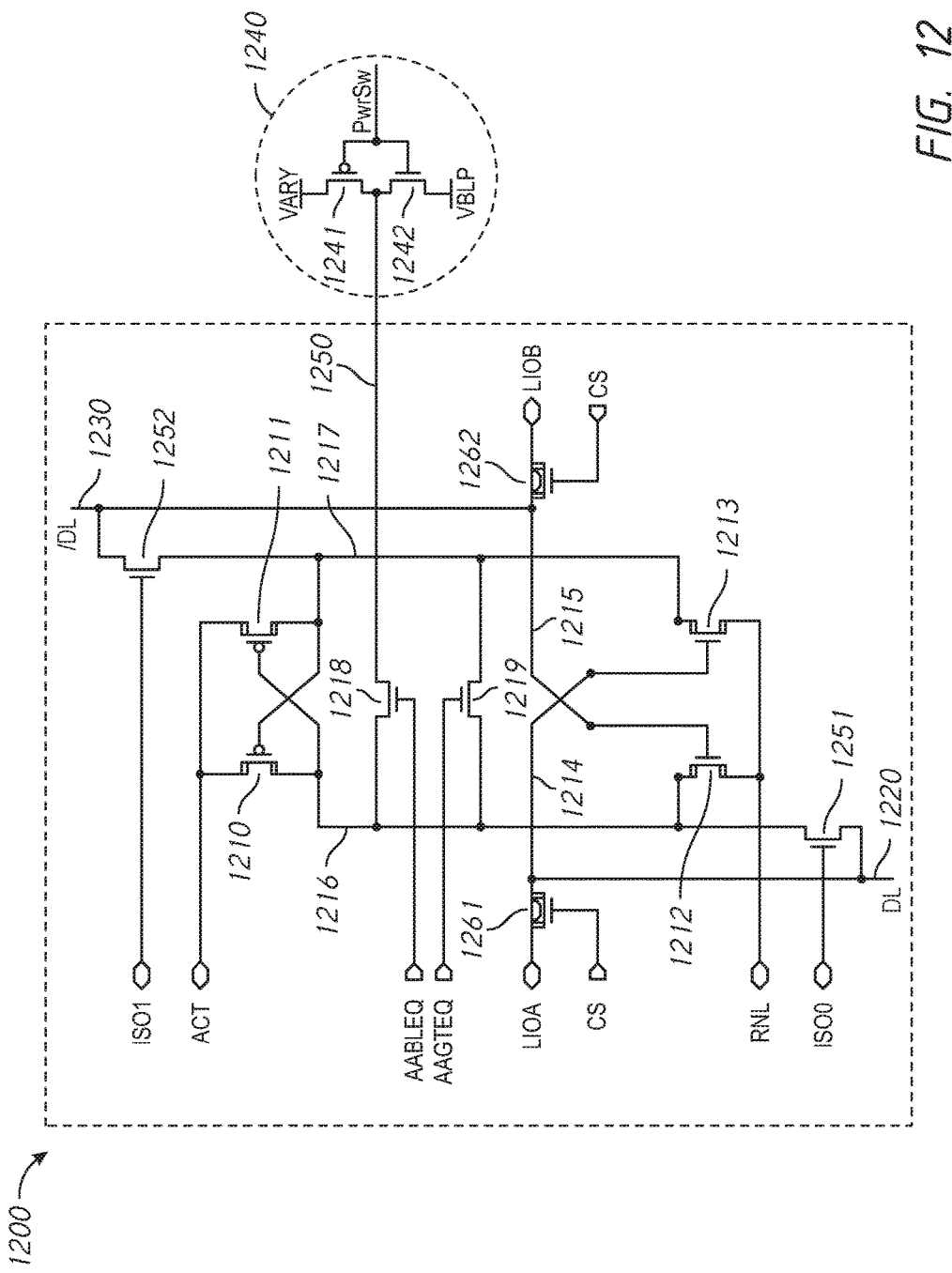
FIG. 12 is a circuit diagram of a sense amplifier in accordance with an embodiment of the disclosure.

FIG. 12 is a circuit diagram of a sense amplifier 1200 in accordance with an embodiment of the disclosure. The sense amplifier 1200 may be included as each sense amplifier of the sense amplifiers 232 of FIG. 2. For example, the sense amplifier 1200 may include first type of transistors (e.g. p-type field effect transistors (PFET)) 1210, 1211 having drains coupled to drains of second type of transistors (e.g., n-type field effect transistors (NFET)) 1212, 1213, respectively. The first type of transistors 1210, 1211 and the second type of transistors 1212, 1213 form complementary transistor inverters including a first inverter including the transistors 1210 and 1212 and a second inverter including the transistors 1211 and 1213. The first type of transistors 1210, 1211 may be coupled to a Psense amplifier control line (e.g., an activation signal ACT) which may provide a supply voltage (e.g., an array voltage VARY: Vcc for memory cell arrays) at an active "high" level. The second type of transistors 1212, 1213 may be coupled to an Nsense amplifier control line (e.g., a Row Nsense Latch signal RNL) that may provide a reference voltage (e.g., GND) at an active "low" level. The sense amplifier 1200 may sense and amplify the data state applied to sense nodes 1214, 1215 through the digit (or bit) lines DL 1220 and/DL 1230, respectively. Nodes 1216 and 1217 that may be gut nodes coupled to drains of the second type of transistors 1212, 1213 may be coupled to the digit lines 1220 and 1230 via isolation transistors 1251 and 1252, controlled by isolation signals ISO0 and ISO1. For example, the digit lines 1220 and 1230 (sense nodes 1214 and 1215) may be coupled to local input/output nodes A and B (LIOA/B) through the second type of transistors 1261 and 1262, respectively, which may be conductive when a column select signal CS is active.

The sense amplifier 1200 may include transistors 1218 and 1219, where the transistor 1218 may couple the gut node 1216 to a global power bus 1250 and the transistor 1219 may couple the gut node 1216 to the gut node 1217. The global power bus 1250 may be coupled to a power switch 1240. The power switch 1240 may switch between a node coupled to an array voltage VARY and a node coupled to a bit line precharge voltage VBLP. Thus, the global power bus 1250 may provide either the array voltage VARY or the bit line precharge voltage VBLP. For example, the bit line precharge voltage VBLP may be smaller (e.g., one-half) than the array voltage VARY. For example, the power switch 1240 may include a first type of transistor 1241 that may couple the global power bus 1250 to the array voltage VARY and a second type of transistor 1242 that may couple the global power bus 1250 to the bit line precharge voltage VBLP. Gates of the transistors 1241 and 1242 may receive a power switch signal PwrSw, and one of the transistors 1241 and 1242 may be conductive to couple the global power bus 1250 to either the array voltage VARY or the bit line precharge voltage VBLP. The transistors 1218 and 1219 may couple the global power bus 1250 to the gut nodes 1216 and 1217 responsive to equilibrating signals AAGTEQ and AABLEQ provided on gates of the transistors 1218 and 1219.

Figure 13:
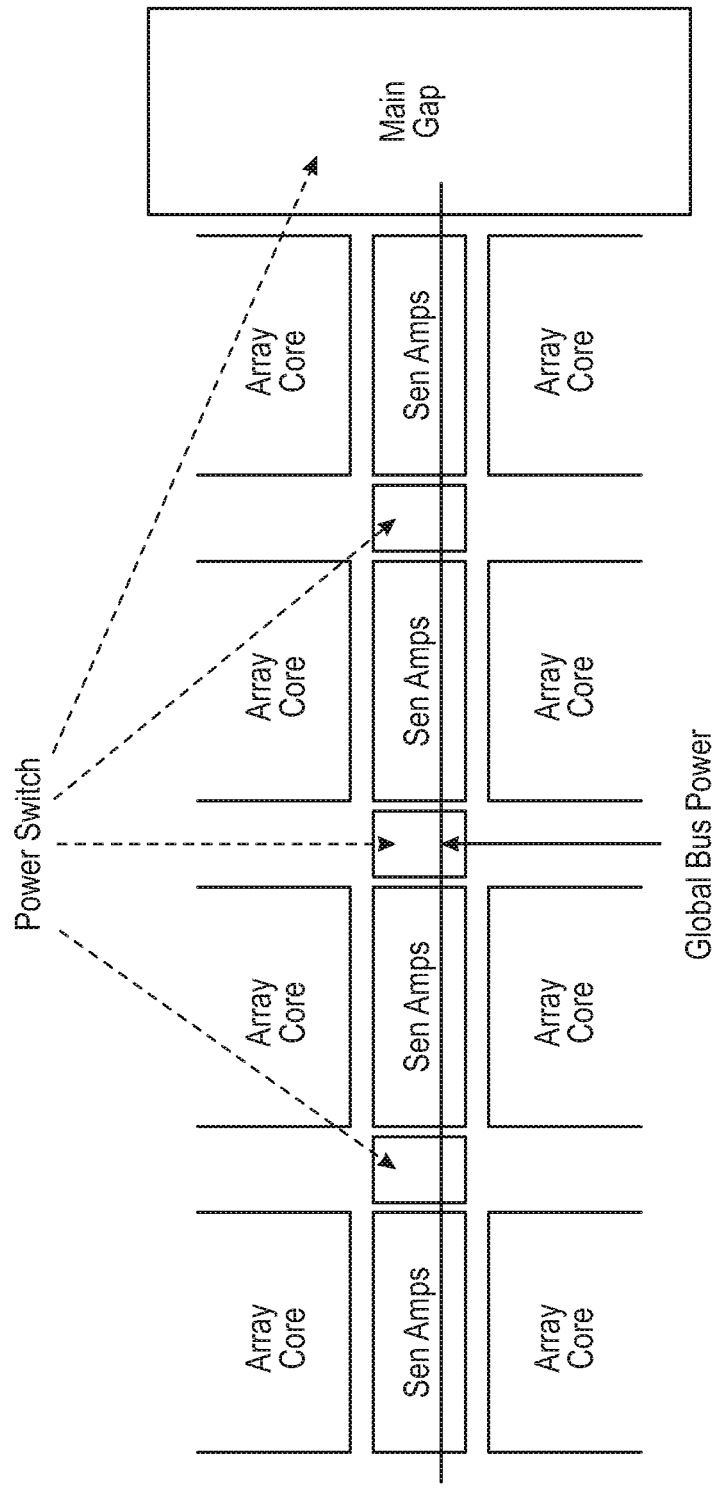
FIG. 13 is a layout diagram of memory cell arrays and a plurality of sense amplifiers in accordance with an embodiment of the disclosure.

FIG. 13 is a layout diagram of memory cell arrays and a plurality of sense amplifiers in accordance with an embodiment of the disclosure. For example, array cores may be included in the memory array 202 of FIG. 2. The memory array cores may include a plurality of memory cells. A group of sense amplifiers (Sen Amps), such as the sense amplifiers 232 in FIG. 2, may be disposed between adjacent array cores. Each sense amplifier of the group of sense amplifiers (Sen Amps) may be the sense amplifier 500 in FIG. 5 or the sense amplifier 1200 in FIG. 12. The power switch 540 of FIG. 5 or the power switch 1240 of FIG. 12 may be included in either one of areas between the sense amplifiers (Sen Amps) or in a main gap, and the areas and groups of sense amplifiers (Sense Amp) may be coupled to a global power bus, that may be the global power bus 550 in FIG. 5 or the global power bus 1250 in FIG. 12.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a first digit line and a second digit line, each digit line of the first and second digit lines coupled to at least one memory cell;
   a sense amplifier, comprising:
      a first transistor and a second transistor having gates configured to be operatively coupled to the first digit line and drains coupled to each other at a first node, wherein a source of the first transistor is coupled to a first sense amplifier control line configured to provide a first power supply voltage and a source of the second transistor is coupled to a second sense amplifier control line configured to provide a second power supply voltage;
      a third transistor and a fourth transistor having gates configured to be operatively coupled to the second digit line and drains coupled to each other at a second node, wherein a source of the third transistor is coupled to the first sense amplifier control line and a source of the fourth transistor is coupled to the second sense amplifier control line;
      a power line configured to be coupled to the first node and the second node; and
      a power switch coupled to the power line, wherein the power switch is configured to couple the power line to either the first power supply voltage or a third power supply voltage that is smaller than the first power supply voltage responsive to a power switch signal;
   a word line coupled to the at least one memory cell of the first digit line, wherein the power switch is configured to couple the power line to the first power supply voltage on or after the word line is set to an active mode;
   a fifth transistor coupled between the second node and the first digit line; and
   a sixth transistor coupled between the first node and the second digit line, wherein the fifth transistor and the sixth transistor are configured to be non-conductive responsive to the word line in the active state.

2. The apparatus of claim 1, further comprising a first input/output line and a second input/output line, wherein the first digit line is configured to be coupled to the first input/output line and the second digit line is configured to be coupled to the second input/output line responsive to a control signal in an active state.

3. The apparatus of claim 2, wherein the power switch is configured to couple the power line to the third power supply voltage after the control signal is set to an inactive state.

4. The apparatus of claim 1, further comprising first and second isolation transistors configure to couple or decouple the first and second digit lines from the first and the second nodes respectively, responsive to at least one isolation signal in an active state, and
   wherein the first sense amplifier control line is set to the first power supply voltage after the at least one isolation signal becomes the active state.

5. The apparatus of claim 1, wherein the power switch comprises a first switch transistor of a first type and a second switch transistor of a second type different from the first type,
   wherein drains of the first switch transistor and the second switch transistor are coupled to the power line,
   wherein a source the first switch transistor is coupled to the first power supply voltage and a source of the second switch transistor is coupled to the third power supply voltage, and
   wherein the gates of the first switch transistor and the second switch transistor are configured to receive the power switch signal.

6. The apparatus of claim 1, wherein the third power supply voltage is approximately one-half of the first power supply voltage.

7. An apparatus comprising:
   a first digit line and a second digit line, each digit line of the first and second digit lines coupled to at least one memory cell;
   a sense amplifier, comprising:
      a first transistor and a second transistor having gates configured to be operatively coupled to the first digit line and drains coupled to each other at a first node, wherein a source of the first transistor is coupled to a first sense amplifier control line configured to provide a first power supply voltage and a source of the second transistor is coupled to a second sense amplifier control line configured to provide a second power supply voltage;
      a third transistor and a fourth transistor having gates configured to be operatively coupled to the second digit line and drains coupled to each other at a second node, wherein a source of the third transistor is coupled to the first sense amplifier control line and a source of the fourth transistor is coupled to the second sense amplifier control line;
      a power line configured to be coupled to the first node and the second node; and
      a power switch coupled to the power line, wherein the power switch is configured to couple the power line to either the first power supply voltage or a third power supply voltage that is smaller than the first power supply voltage responsive to a power switch signal;
   a word line coupled to the at least one memory cell of the first digit line, wherein the power switch is configured to couple the power line to the first power supply voltage on or after the word line is set to an active mode; and a fifth transistor configured to couple the power line to the first and second nodes responsive to an equilibrating signal,
wherein the equilibrating signal is set to an active state responsive to the word line in the active mode at a first time, and
wherein the equilibrating signal is further set to an inactive state before the first sense amplifier control line is set to the first power supply voltage.

8. The apparatus of claim 7, wherein the power switch is configured to couple the power line to the third power supply voltage before the equilibrating signal is set to an active state at a second time after the first time.

9. The apparatus of claim 7, further comprising a first input/output line and a second input/output line,
wherein the first digit line is configured to be coupled to the first input/output line and the second digit line is configured to be coupled to the second input/output line responsive to a control signal in an active state.

10. The apparatus of claim 9, wherein the power switch is configured to couple the power line to the third power supply voltage after the control signal is set to an inactive state.

11. The apparatus of claim 7, further comprising first and second isolation transistors configure to couple or decouple the first and second digit lines from the first and the second nodes respectively, responsive to at least one isolation signal in an active state, and
wherein the first sense amplifier control line is set to the first power supply voltage after the at least one isolation signal becomes the active state.

12. The apparatus of claim 7, wherein the power switch comprises a first switch transistor of a first type and a second switch transistor of a second type different from the first type,
wherein drains of the first switch transistor and the second switch transistor are coupled to the power line,
wherein a source the first switch transistor is coupled to the first power supply voltage and a source of the second switch transistor is coupled to the third power supply voltage, and
wherein the gates of the first switch transistor and the second switch transistor are configured to receive the power switch signal.

13. The apparatus of claim 7, wherein the third power supply voltage is approximately one-half of the first power supply voltage.

* * * * *